United States Patent [19]

Hayase et al.

[11] Patent Number: 4,495,042

[45] Date of Patent: Jan. 22, 1985

[54] PHOTO-CURABLE EPOXY RESIN COMPOSITION

[75] Inventors: Shuzi Hayase, Kawasaki; Yasunobu Onishi; Shuichi Suzuki, both of Yokohama, all of Japan

[73] Assignee: Tokyo Shibaura Denki Kabushiki Kaisha, Kawasaki, Japan

[21] Appl. No.: 482,305

[22] Filed: Apr. 5, 1983

[30] Foreign Application Priority Data

Apr. 7, 1982 [JP] Japan ............................... 57-56644

[51] Int. Cl.$^3$ ........................... C08J 3/28; C08L 63/00
[52] U.S. Cl. ........................... 204/159.14; 204/159.11; 204/159.23; 204/159.24
[58] Field of Search ................... 204/159.14, 159.23, 204/159.24, 159.11

[56] References Cited

U.S. PATENT DOCUMENTS

| | | | |
|---|---|---|---|
| 3,708,296 | 1/1973 | Schlesinger | 96/33 |
| 4,081,276 | 3/1978 | Crivello | 96/35.1 |
| 4,179,400 | 12/1979 | Tsao et al. | 204/159.14 |
| 4,308,118 | 12/1981 | Dudgeon | 204/159.14 |
| 4,383,025 | 5/1983 | Green et al. | 204/159.14 |

OTHER PUBLICATIONS

J. V. Crivello and J. H. W. Lam, "Photoinitiated Cationic Polymerization by Dialkylphenacylsulfonium Salts", *Journal of Polymer Science*, pp. 2877–2892, (1979).

D. H. Rich and S. K. Gurwara, "Preparation of a New o-Nitrobenzyl Resin for Solid-Phase Synthesis of tert-Butyloxycarbonyl-Protected Peptide Acids", *Journal of American Chemical Society*, pp. 1575–1579, (1975).

*Primary Examiner*—Allan M. Lieberman
*Attorney, Agent, or Firm*—Schwartz, Jeffery, Schwaab, Mack, Blumenthal & Koch

[57] ABSTRACT

There is disclosed a photo-curable epoxy resin composition comprising an epoxy resin and a combination of an organic aluminum compound and a silicon compound having an o-nitrobenzyloxy group as a catalyst.

The compositions of the present invention are suitable for electrical uses in electrical application.

7 Claims, No Drawings

PHOTO-CURABLE EPOXY RESIN COMPOSITION

This invention relates to a novel photo-curable epoxy resin composition, and more particulaly to a photo-curable epoxy resin composition which has been improved in curing characteristics and which provides a cured product having suitable electric characteristics for use as insulating and heat resistant material in electric equipment.

Recently, a process for hardening a resin by use of a light has attracted attention to save energy and improve operating efficiency in the field of resins. Among others, processes for photo-curable epoxy resins are regarded as important because of the wide range of their possible applications. In a process for photo-curing an epoxy resin, the epoxy resin itself is very important, besides the curing conditions. Thus, compositions having various formulations have been studied. The photo-curable epoxy resin compositions, which have hitherto been known to the art, can roughly be classified into two groups.

One is an epoxy resin which has been modified by using a photo-polymerizable compound containing a double bond or bonds, such as acrylic acid and its derivatives. As such modified epoxy resin, there may be mentioned, for example,

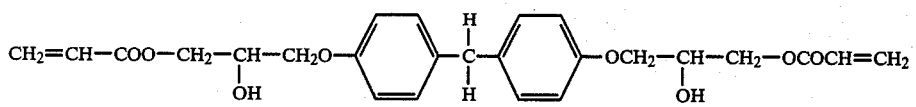

[see Japanese Provisional Patent Publication No. 11920/1981].

The other is an epoxy resin containing a photo-decomposable catalyst which is to be cured by the catalyst. As the photo-decomposable catalyst used for the purpose, there may be mentioned the complex having the following formula:

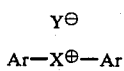

wherein Ar represents a phenyl group and the like; X represents an iodine atom, a sulfur atom, a diazo group or the like; and Y represents $BF_4$, $PF_6$, $AsF_6$, $SbF_6$ or the like.

[see, for example, Macromolecules, Vol. 10, 1307 (1977); Journal of Radiation Curing, Vol. 5, 2 (1978); Journal of Polymer Science Polymer Chemistry Edition, Vol. 17, 759 (1979); Journal of Polymer Science Polymer Letters Edition, Vol. 17, 759 (1979); Japanese Provisional Patent Publication No. 65219/1980; U.S. Pat. No. 4,069,054; and British Pat. Nos. 1,516,511 and 1,518,141.]

However, photo-cured products obtained from the former type, i.e. modified epoxy type resins, have the defects that heat resistance is considerably inferior to that of photo-cured products obtained from epoxy resins themselves.

On the other hand, in case of the latter type, i.e. the epoxy resin compositions containing the photo-decomposable catalysts, obtained photo-cured products show good mechanical and thermal characteristics. In this case, however, the catalyst components remain as ionic impurities in the photo-cured products so that when such photo-cured products containing the ionic impurities are used in electric equipment, the ionic impurities adversely affect the electric characteristics of the photo-cured products such as an electric insulation ability and sometimes cause electric equipment or the like to corrode.

An object of this invention is to provide a photo-curable epoxy resin composition which has good photo-curability and gives a cured product having excellent mechanical and thermal characteristics and containing no ionic impurities, thereby eliminating the disadvantages of the conventional photo-curable epoxy resin compositions described above.

The photo-curable epoxy resin composition according to this invention comprises an epoxy resin and a combination of an organic aluminum compound and a silicon compound having an o-nitrobenzyloxy group as a photo-decomposable catalyst. The epoxy resin composition may further contain an active proton-containing compound.

The composition according to this invention will be described more detail in the following description of preferred embodiments.

The epoxy resin used in the present invention means an epoxy resin compound alone; and a system comprising an epoxy compound and a curing agent therefor such as acid anhydrides, phenolic compounds, etc.

Examples of epoxy compounds which may be used in accordance with the present invention are bisphenol A type epoxy resins, bisphenol F type epoxy resins, phenolnovolac type epoxy resins, heterocyclic ring-containing epoxy resins such as triglycidyl isocyanurate and hydantoin epoxy, hydrogenated bisphenol A type epoxy resins, aliphatic epoxy resins such as propylene glycol diglycidyl ether and pentaerythrytol polyglycidyl ethers, glycidyl ester type epoxy resins obtained by the reaction of an aromatic, aliphatic or cycloaliphatic carboxylic acid with epichlorohydrin, spiro-ring containing epoxy resins, glycidyl ether type epoxy resins obtained by the reaction of an ortho-allylphenol novolak compound with epichlorohydrin, glycidyl ether type epoxy resins obtained by the reaction of epichlorohydrin with a diallyl bisphenol compound having an allyl group at the ortho-position with respect to each hydroxy group of bisphenol A, and the like.

Acid anhydrides which may be used as curing agents for the epoxy compounds in accordance with the present invention include phthalic anhydride, hexahydrophthalic anhydride, tetrahydrophthalic anhydride, methyltetrahydrophthalic anhydride, methylhexahydrophthalic anhydride, nadic anhydride, methylnadic anhydride, chlorendic anhydride, dodecenylsuccinic anhydride, methylsuccinic anhydride, benzophenonetetracarboxylic anhydride, pyromellitic anhydrie, maleic anhydride and the like. These acid anhydrides are preferably used in an amount of 1.0 equivalent or less based on the epoxy compounds.

The phenolic compounds which may be added to the epoxy resins in accordance with the present invention may, for example, be bisphenol A, bisphenol F, bisphenol S, and condendates of formaldehyde and the like with phenols such as phenol, cresol and bisphenol A. These phenolic compounds are preferably used in an amount of 0.8 equivalent or less based on the epxoy compounds.

The organic aluminum compounds used as one component of the photo-decomposable catalysts according to this invention are the compounds having an organic group selected from the group consisting of an alkyl group, a phenyl group, a haloalkyl group, an alkoxy group, a phenoxy group, an acyloxy group, a β-diketonato group and an o-carbonylphenolato group.

In the above-mentioned organic group, as the alkyl group, there may be mentioned, for example, a methyl group, an ethyl group, a n-propyl group, an isopropyl group, a n-butyl group, a sec-butyl group, a tert-butyl group and a n-pentyl group; as the phenyl group, there may be mentioned, for example, a phenyl group, a p-methoxyphenyl group, an o-methoxyphenyl group and a p-methoxyphenyl group; as the haloalkyl group, there may be mentioned, for example, a chloromethyl group, a chloroethyl group and a chloropropyl group; as the alkoxy group, there may be exemplified, a methoxy group, an ethoxy group, an isopropoxy group, a butoxy group and a pentoxy group; as the phenoxy group, there may be mentioned, for example, a phenoxy group, an o-methylphenoxy group, an o-methoxyphenoxy group, a p-nitrophenoxy group and a 2,6-dimethylphenoxy group; as the acyloxy group, there may be mentioned, for example, each group of an acetato, a propionato, an isopropionato, a butyrato, a stearato, an ethylacetoacetato, a propylacetoacetato, a butylacetoacetato, a diethylaceteacetato, a diethylmalonato and a dipivaloylmethanato; as the β-diketonato group, there may be exemplified, each group of an acetylacetonato, a trifluoroacetylacetonato, a hexafluoroacetylacetonato,

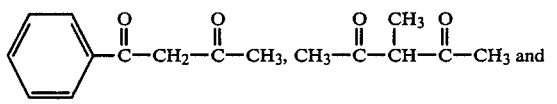

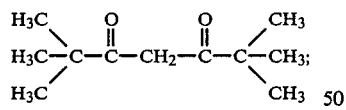

and as the o-carbonylphenolato group, there may be mentioned, for example, a salicylaldehydato group.

The organic aluminum compounds include trimethoxyaluminum, triethoxyaluminum, triisopropoxyaluminum, triphenoxyaluminum, tris(p-methylphenoxy)aluminum, isopropoxydiethoxyaluminum, tributoxyaluminum, triacetoxyaluminum, aluminum tristearate, aluminum tributyrate, aluminum tripropionate, aluminum triisopropionate, trisacetylacetonatoaluminum, tris(trifluoroacetylacetonato)aluminum, tris(hexafluoroacetylacetonato)aluminum, aluminum trisethylacetoacetate, aluminum trissalicylaldehyde, aluminum tris(diethylmalonate), aluminum trispropylacetoacetate, aluminum trisbutylacetoacetate, tris(dipivaloylmethanato)aluminum, diacetylacetonatodipivaloylmethanatoaluminum,

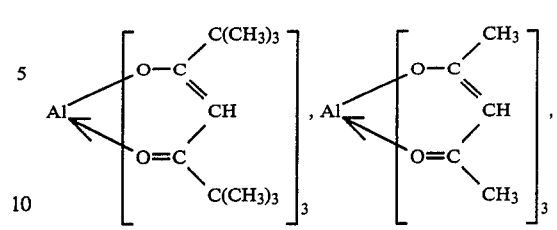

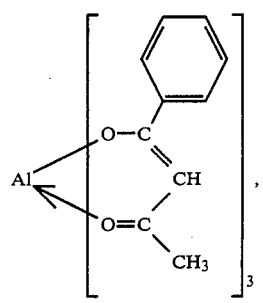

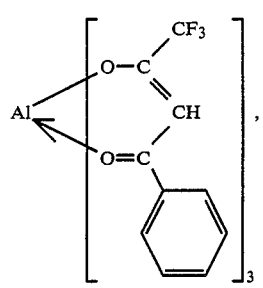

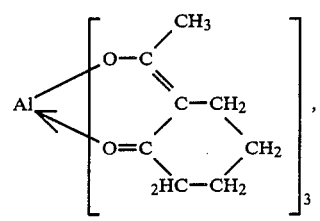

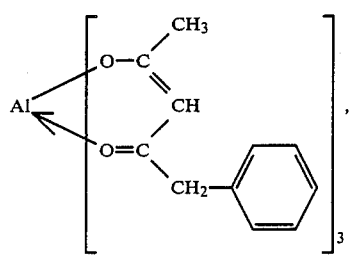

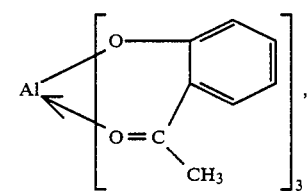

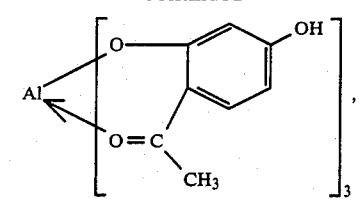

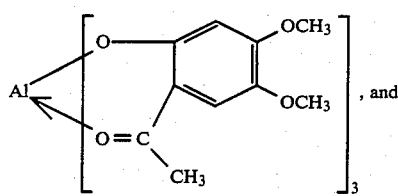

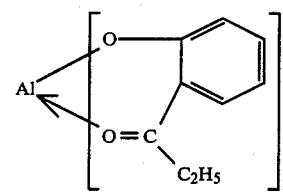

These organic aluminum compounds may be used independently or in admixture with one another. They are generally used in an amount of 0.001 to 10% by weight, preferably 0.1 to 5% by weight based on the epoxy resins. An amount of the organic aluminum compounds below 0.001% by weight cannot give sufficient curing characteristics, whereas an amount thereof in excess of 10% by weight would make cost of the compositions expensive and cause the electric characteristics to deteriorate.

The silicon compounds having o-nitrobenzyloxy group used as another component of the photo-decomposable catalysts in accordance with the present invention are the compounds having the following formula:

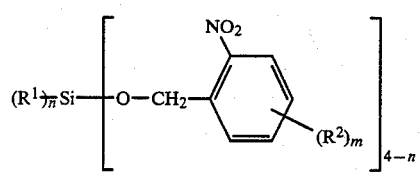

in which $R^1$ represents a hydrogen atom, a halogen atom, an alkyl group having from 1 to 5 carbon atoms or aryl group having from 1 to 5 carbon atoms; $R^2$ represents a halogen atom, an alkyl group having from 1 to 5 carbon atoms or an alkoxy group having from 1 to 5 carbon atoms; m represents an integer from 0 to 4; n represents an integer from 0 to 3; plural number of the o-nitrobenzyloxy groups may be the same or different from each other; plural number or $R^1$'s may be the same or different from each other; and plural number of $R^2$'s may be the same or different from each other; provided that the case where m is an integer of 3 or less, the above-mentioned benzene ring of o-nitrobenzyloxy group is bonded hydrogen atoms.

The alkyl group having from 1 to 5 carbon atoms may, for example, be methyl, ethyl, isopropyl, n-propyl, n-butyl, tert-butyl, sec-butyl, n-pentyl, and the like. The alkoxy group having from 1 to 5 carbon atoms may, for example, be methoxy, ethoxy, isopropoxy, n-butoxy, n-pentyloxy, and the like. The aryl group may, for example, be phenyl, naphthyl, anthranyl, benzyl, and the like. These alkyl group having from 1 to 5 carbon atoms, alkoxy group having from 1 to 5 carbon atoms and aryl group may be substituted with an halogen atom, a nitro group, a cyano group, a methoxy group or the like.

The following may be cited as concrete examples of the silicon compounds having o-nitrobenzyloxy group:

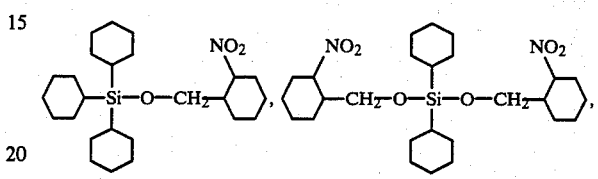

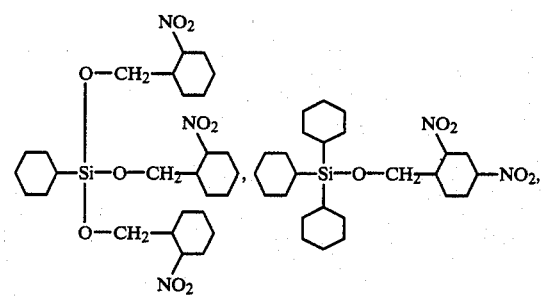

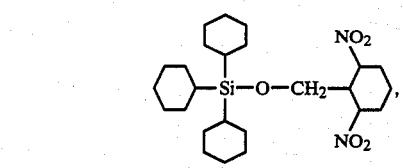

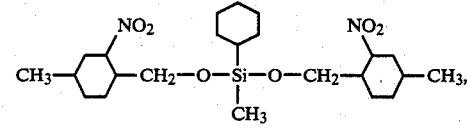

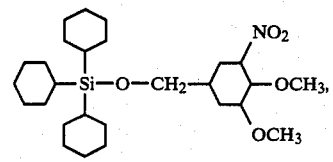

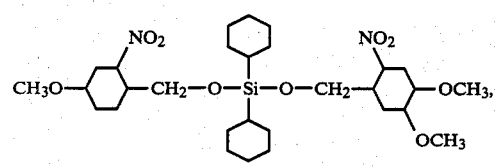

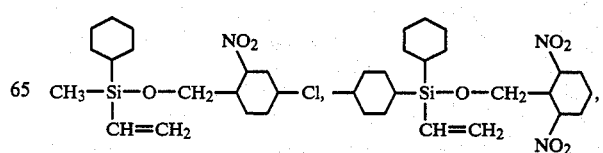

-continued

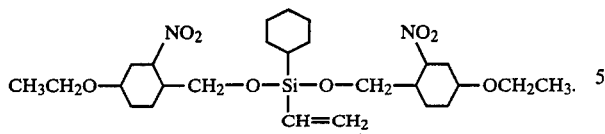

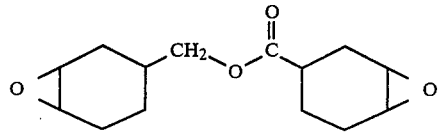

These silicon compounds are generally used in an amount of 0.1 to 20% by weight, preferably 1 to 10% by weight, based on the epoxy resins. An amount of silicon compounds below 0.1% by weight cannot give sufficient curing characteristics, on the contrary an amount thereof in excess of 20% by weight can also be used, but would make the compositions expensive and would present a problem concerning decomposition products of the catalyst components.

The photo-curable compositions of the present invention can be cured by methods such as room-temperature photo-curing, high-temperature photo-curing, after-cure which is effected after the photo-curing, etc. The wavelength of light necessary for the photo-curing will generally be from 180 nm to 700 nm, preferably from 300 nm to 500 nm; the irradiation time will generally be from 5 sec. to 180 min., preferably from 20 sec. to 60 min., depending on the epoxy resin compositions and the catalyst to be used; and the temperature in case of high-temperature photo-curing will generally be from 20° C. to 200° C., preferably from 60° C. to 100° C., depending on the epoxy resin compositions and the catalyst to be used, and in case of after-cure which is effected after the photo-curing will generally be from 50° C. to 200° C., preferably from 100° C. to 180° C., and effected form 1 hr. to 10 hrs., preferably from 2 hrs. to 5 hrs., depending on the epoxy resin compositions and the catalyst to be used. As the light source to be used in this invention, any kind of light source may be available, so long as it is ordinarily used for photo-curing, including low-pressure mercury-vapor lamps, high-pressure mercury-vapor lamps, metal halogen lamps, xenon-mercury lamps, xenon lamps, hydrogen glow discharge tubes, tungsten glow discharge tubes, halogen lamps, sodium glow discharge tubes, neon glow discharge tubes, argon glow discharge tubes, He-Ne lasers, Ar ion lasers, $N_2$ lasers, Cd ion lasers, He-Cd lasers, coloring lasers and the like. Such light sources may be used alone or in combination with two or more kinds selected from the group consisting of the light sources as described above.

The resulting cured products show excellent electrical characteristics.

This invention will further be illustrated below in accordance with the following nonlimitative examples.

EXAMPLE 1

A mixture was prepared from 10 g of ERL 4221 (Trade Name, available from UCC Co. Ltd.; the compound having the following formula (1), epoxy equivalent: 130, molecular weight: 260), 0.1 g of tris(n-butylacetoacetato)aluminum and 0.1 g of di(o-nitrobenzyloxy)diphenylsilane. The mixture was applied onto an aluminum plate. When exposed to an ultraviolet ray emitted from a metal halide lamp (2 KW, 80 W/cm) for 20 seconds, a satisfactory cured resin plate resulted. Measurement of the electric characteristics of the cured resin plate indicated that a tan δ value thereof was 2.5% at 200° C.

EXAMPLE 2

A mixture was prepared from 10 g of Chisso Nox 206 (Trade Name, available from Chisso Corporation, Japan; the compound having the following formula (2), epoxy equivalent: 70, molecular weight: 139), 10 g of Epikote 828 (Trade Name, available from Shell Kagaku K. K., Japan; bisphenol A type epoxy resin, epoxy equivalent: 190–210, molecular weight: 380), 0.1 g of aluminum trisethylacetoacetato and 0.4 g of triphenyl o-nitrobenzyloxysilane. When the mixture was applied onto an aluminum plate in the same manner as in Example 1 and exposed to an ultraviolet ray, a satisfactory cured resin plate resulted. Measurement of the electric characteristics of the cured resin plate indicated that a tan δ value thereof was 7.5% at 200° C.

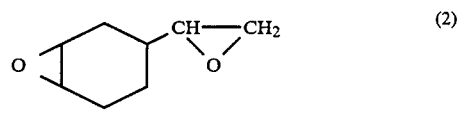

EXAMPLE 3

A mixture was prepared from 100 g of ERL 4221, 50 g of Epikote 154 (Trade Name, available from Shell Kagaku K. K., Japan; phenol novolac type epoxy resin, epoxy equivalent: B 172–180), 50 g of Epikote 828, 1 g of aluminum trissalicylaldehyde and 4 g of di-(2,6-dinitrobenzyloxy)diphenylsilane. The mixture was applied onto an aluminum plate. When exposed at 60° C. to an ultraviolet ray emitted from a mercury lamp (400 W) for 30 seconds, a satisfactory cured resin plate resulted. Measurement of the electric characteristics of the cured resin plate indicated that a tan δ value thereof was 6.3% at 180° C.

EXAMPLE 4

A mixture was prepared from 100 g of Epikote 828, 50 g of Epikote 152 (Trade Name, available from Shell Kagaku K. K., Japan; phenol novolac type epoxy resin, epoxy equivalent: 172–179), 20 g of bisphenol F, 2 g of aluminum trissalicylaldehyde and 6 g of di-(o-nitrobenzyloxy)diphenylsilane. The resulting mixture was exposed to an ultraviolet ray for 5 minutes in the same manner as in Example 1 to obtain a cured resin plate. The cured resin plate was then after-cured at 150° C. for 3 hours to yield a satisfactory cured resin plate. Measurement of the electric characteristics of the obtained resin plate indicated that a tan δ value thereof was 6.5% at 180° C.

EXAMPLE 5

A mixture was prepared from 100 g of ERL 4221, 100 g of Epikote 154, 180 g of hexahydrophthalic anhydride, 4 g of aluminum trissalicylaldehyde and 5 g of di-(o-nitrobenzyloxy)diphenylsilane. The mixture was applied onto an aluminum plate and exposed to an ultraviolet ray for 2 minutes in the same manner as in Example 1 to obtain a cured resin plate. The cured resin plate was then after-cured at 150° C. for 5 hours to yield a satisfactory cured resin plate. Measurement of the electric characteristics of the obtained resin plate indicated that a tan δ value thereof was 4.3% at 180° C.

COMPARATIVE EXAMPLE 1

A mixture was prepared from 10 g of ERL 4221 and di-(o-nitrobenzyloxy)diphenylsilane. The mixture was treated in the same manner as in Example 1, whereupon no polymer was obtained.

COMPARATIVE EXAMPLE 2

A mixture was prepared from 100 g of ERL 4221, 30 g of Epikote 154, 30 g of Epikote 828 and 0.3 g of diphenyliodonium tetrafluoroboric acid salt. The mixture was treated in the same manner as in Example 3. The tan δ value of this after-cured resin plate could not be measured at 180° C.

As is clear from the above examples, the compositions of the present invention quickly harden when exposed to light and give cured products which show excellent electric insulating characteristics.

The photo-curable epoxy resin compositions of the present invention harden in a short time when exposed to light due to the use of an aluminum compound and a silicon compound having an o-nitrobenzyloxy group as a catalyst component. Moreover, the obtained cured product has excellent electric characteristics such as a tan δ value since it contains no ionic impurities, and thereby does not cause the electric equipment to corrode when the product is used in electric equipment. Therefore, the cured product is suitable for electric uses in electrical applications, for example, as resist materials and insulating materials in electric equipment, particularly as coil insulators. It can thus be concluded that such a photo-curable epoxy resin composition is industrially valuable and beneficial.

We claim:

1. A photo-curable epoxy resin composition, comprising:
    an epoxy resin;
    a combination of an organic aluminum compound selected from the group consisting of an alkoxy aluminum compound, an aryloxy aluminum compound, an acyloxy aluminum compound, and an aluminum chelate compound, wherein said organic aluminum compound is present in an amount of from about 0.001 to 10% by weight based on the epoxy resin; and
    a silicon compound comprising an o-nitrobenzyloxy group as a catalyst, wherein said silicon compound is present in an amount of from about 0.1 to 20% by weight based upon the epoxy resin.

2. A photo-curable epoxy resin composition according to claim 1, wherein said organic aluminum compounds is used in an amount of from about 0.1 to 5% by weight based on the epoxy resin.

3. A photo-curable epoxy resin composition according to claim 1, wherein said silicon compound having an o-nitrobenzyloxy group has the following general formula:

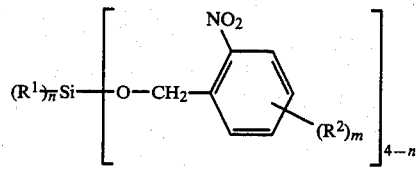

in which $R^1$ represents a hydrogen atom, a halogen atom, an alkyl group or aryl group having from 1 to 5 carbon atoms; $R^2$ represents a halogen atom, an alkyl group having from 1 to 5 carbon atoms or an alkoxy group having from 1 to 5 carbon atoms; m represents an integer from 0 to 4; n represents an integer from 0 to 3; plural number of the o-nitrobenzyloxy groups may be the same or different from each other; plural number of $R^1$'s may be the same or different from each other; and plural number of $R^2$'s may be the same or different from each other; provided that the case where m is an integer of 3 or less, the above-mentioned benzene ring of o-nitrobenzyloxy group is bonded hydrogen atoms.

4. A photo-curable epoxy resin composition according to claim 1, wherein said silicon compound having an o-nitrobenzyloxy group is used in an amount of from about 1 to 10% by weight based on the epoxy resin.

5. A photo-curable epoxy resin composition according to claim 1, wherein said silicon compound comprises di-(o-nitrobenzyloxy)diphenylsilane.

6. A photo-curable epoxy resin composition according to claim 1, wherein said silicon compound comprises triphenyl o-nitrobenzyloxysilane.

7. A photo-curable epoxy resin composition according to claim 1, wherein said silicon compound comprises di-(2,6-dinitrobenzyloxy)diphenylsilane.

* * * * *